(12) United States Patent
Yamada

(10) Patent No.: US 12,086,002 B2
(45) Date of Patent: Sep. 10, 2024

(54) POWER SUPPLY DEVICE FOR AVOIDING DATA TRANSMISSION CONFLICT

(71) Applicant: ROHM CO., LTD., Kyoto (JP)

(72) Inventor: Takumi Yamada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 107 days.

(21) Appl. No.: 17/695,293

(22) Filed: Mar. 15, 2022

(65) Prior Publication Data

US 2022/0300053 A1 Sep. 22, 2022

(30) Foreign Application Priority Data

Mar. 18, 2021 (JP) ................................. 2021-044853

(51) Int. Cl.
*G06F 1/26* (2006.01)
*G06F 1/10* (2006.01)
*H01L 23/50* (2006.01)

(52) U.S. Cl.
CPC ................. *G06F 1/26* (2013.01); *G06F 1/10* (2013.01); *H01L 23/50* (2013.01)

(58) Field of Classification Search
None
See application file for complete search history.

(56) References Cited

U.S. PATENT DOCUMENTS

| 10,466,738 | B2* | 11/2019 | Sharpe-Geisler ... | G06F 13/4291 |
| 2017/0097912 | A1* | 4/2017 | Takahashi ............. | G06F 13/362 |
| 2017/0315851 | A1* | 11/2017 | Hicks ................... | G06F 11/0793 |
| 2019/0064910 | A1* | 2/2019 | Wang .................... | G06F 1/3215 |
| 2019/0087378 | A1* | 3/2019 | Srivastava ............... | G06F 1/26 |
| 2020/0333818 | A1* | 10/2020 | Yun ........................ | G06F 1/28 |
| 2021/0208658 | A1* | 7/2021 | Sato ....................... | G06F 1/04 |

FOREIGN PATENT DOCUMENTS

JP 2020-157907 10/2020

* cited by examiner

*Primary Examiner* — Danny Chan
(74) *Attorney, Agent, or Firm* — Fish & Richardson P.C.

(57) ABSTRACT

A power supply system of the present disclosure includes a single first semiconductor integrated circuit (IC), at least one second semiconductor IC, a first transmission line and a second transmission line. Each of the single first semiconductor IC and the at least one second semiconductor IC includes at least one output terminal configured to output an output voltage. The single first semiconductor IC is configured to supply a clock signal to the at least one second semiconductor IC via the first transmission line. Based on the clock signal, one of the single first semiconductor IC and the at least one second semiconductor IC is configured to transmit a data signal via the second transmission line to another one.

11 Claims, 6 Drawing Sheets

| Device ID | Description | Address |
|---|---|---|
| 3'b000 | PN1(Master) | 0x60 |
| 3'b001 | PN1(Slave0) | 0x61 |
| 3'b010 | PN2(Master) | 0x62 |
| 3'b011 | PN2(Slave1) | 0x63 |
| 3'b100 | PN2(Slave2) | 0x64 |
| 3'b101 | PN2(Slave3) | 0x65 |
| 3'b110 | PN2(Slave4) | 0x66 |
| 3'b111 | PN2(Slave5) | 0x67 |

| System serial number | System | | |
|---|---|---|---|
| 0 | 1 Chip | Master circuit (PN1) | 7ch |
| 1 | 1 Chip | Master circuit (PN2) | 2ch |
| 2 | 2 Chips | Master circuit (PN1)/Slave circuit 1 (PN2) | 9ch |
| 3 | 2 Chips | Master circuit (PN1)/Slave circuit 0 (PN1) | 14ch |
| 4 | 3 Chips | Master circuit (PN1)/Slave circuit 1 (PN2)/Slave circuit 2 (PN2) | 11ch |
| 5 | 3 Chips | Master circuit (PN1)/Slave circuit 0 (PN1)/Slave circuit 1 (PN2) | 16ch |
| 6 | 4 Chips | Master circuit (PN1)/Slave circuit 1 (PN2)/Slave circuit 2 (PN2)/Slave circuit 3 (PN2) | 13ch |
| 7 | 4 Chips | Master circuit (PN1)/Slave circuit 0 (PN1)/Slave circuit 1 (PN2)/Slave circuit 2 (PN2) | 18ch |
| 8 | 5 Chips | Master circuit (PN1)/Slave circuit 1 (PN2)/Slave circuit 2 (PN2)/Slave circuit 3 (PN2)/Slave circuit 4 (PN2) | 15ch |
| 9 | 5 Chips | Master circuit (PN1)/Slave circuit 0 (PN1)/Slave circuit 1 (PN2)/Slave circuit 2 (PN2)/Slave circuit 3 (PN2) | 20ch |
| 10 | 6 Chips | Master circuit (PN1)/Slave circuit 1 (PN2)/Slave circuit 2 (PN2)/Slave circuit 3 (PN2)/Slave circuit 4 (PN2)/Slave circuit 5 (PN2) | 17ch |
| 11 | 6 Chips | Master circuit (PN1)/Slave circuit 0 (PN1)/Slave 1 (PN2)/Slave circuit 2 (PN2)/Slave circuit 3 (PN2)/Slave circuit 4 (PN2) | 22ch |

FIG. 3

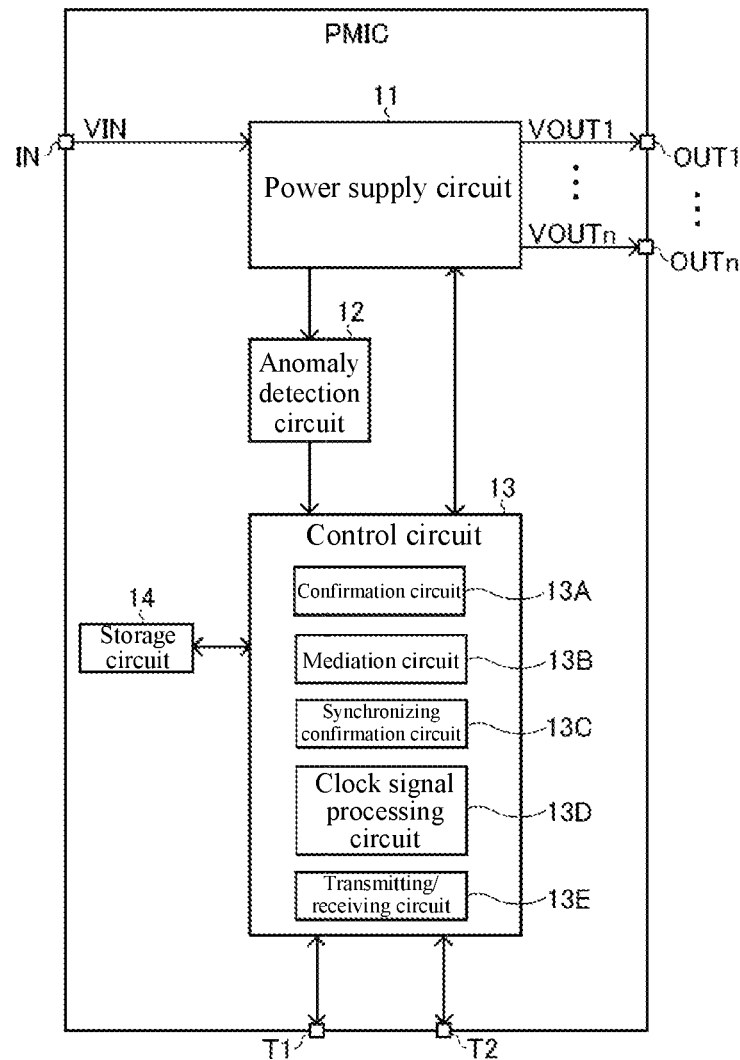

FIG. 4

POWER SUPPLY DEVICE FOR AVOIDING DATA TRANSMISSION CONFLICT

TECHNICAL FIELD

The subject matter of the present disclosure relates to a power supply system including a plurality of output channels.

BACKGROUND

A single power management integrated circuit (PMIC) is commonly used as a power supply system having a plurality output channels (for example, referring to patent publication 1: Japan Patent Publication No. 2020-157907 (paragraph [0021])).

SUMMARY OF THE PRESENT DISCLOSURE

Problems to be Solved by the Present Disclosure

However, in order to handle diversified customer requirements by one single PMIC, there may be an extremely large variety of PMICs, causing an issue of increased development costs of PMICs.

Technical Means for Solving the Problem

A power supply system disclosed by this specification is configured as (a first configuration) including a single first semiconductor integrated circuit (IC), at least one second semiconductor IC, a first transmission line and a second transmission line. Each of the single first semiconductor IC and the at least one second semiconductor IC includes at least one output terminal configured to output an output voltage. The single first semiconductor IC is configured to supply a clock signal to the at least one second semiconductor IC via the first transmission line. Based on the clock signal, one of the single first semiconductor IC and the at least one second semiconductor IC is configured to transmit a data signal via the second transmission line to another one.

The power supply system of the first configuration above may also be configured (a second configuration) such that, each of the single first semiconductor IC and the at least one second semiconductor IC includes a confirmation circuit, configured to confirm that the second transmission line does not transmit the data before starting a transmission of the data signal.

The power supply system of the second configuration above may also be configured (a third configuration) such that, the confirmation circuit is configured to confirm that the second transmission line does not transmit the data signal if a voltage applied to the second transmission line over a predetermined period of the clock signal is at a predetermined level.

The power supply system of the second or third configuration above may also be configured (a fourth configuration) such that, each of the single first semiconductor IC and the at least one second semiconductor IC includes a mediation circuit, configured to mediate an authority of transmitting the data signal before starting a transmission of the data signal when a plurality of the single first semiconductor IC and the at least one second semiconductor IC are scheduled to transmit the data signal.

The power supply system of the fourth configuration above may also be configured (a fifth configuration) such that, the mediation circuit is configured to, based on a level of the voltage applied to the second transmission line, determine whether or not the plurality of the single first semiconductor IC and the at least one second semiconductor IC are scheduled to transmit the data signal.

The power supply system of any one of the first to fifth configurations above may also be configured (a sixth configuration) such that, each of the single first semiconductor IC and the at least one second semiconductor IC includes a synchronizing confirmation circuit, configured to confirm a synchronization with the clock signal before starting a transmission of the data signal.

A semiconductor integrated circuit (IC) disclosed by this specification is configured as (a seventh configuration) including: a first terminal, connectable to a first transmission line; a second terminal, connectable to a second transmission line; at least one output terminal, configured to output an output voltage; a clock signal processing circuit, configured to output a first clock signal from the first terminal in a first setting and output a second clock signal from the first terminal in a second setting; and a transmitting/receiving circuit, configured to, in the first setting, receive a first data signal input to the second terminal based on the first clock signal, and transmit a second data signal output from the second terminal based on the first clock signal, and in the second setting, receive the first data signal input to the second terminal based on the second clock signal, and transmit the second data signal output from the second terminal based on the second clock signal.

A vehicle disclosed by this specification is configured to include the power supply system of any one of the first to sixth configurations (an eighth configuration).

Effects of the Present Disclosure

According to the subject matter disclosed by this specification, a power supply system capable of handling diversified customer requirements can be provided at low costs.

BRIEF DESCRIPTION OF THE DRAWINGS

FIG. 3 is an exemplary diagram of system serial numbers.

FIG. 4 is a brief configuration diagram of a power management integrated circuit (PMIC).

DETAILED DESCRIPTION OF THE EMBODIMENTS

Figures 1, 2:
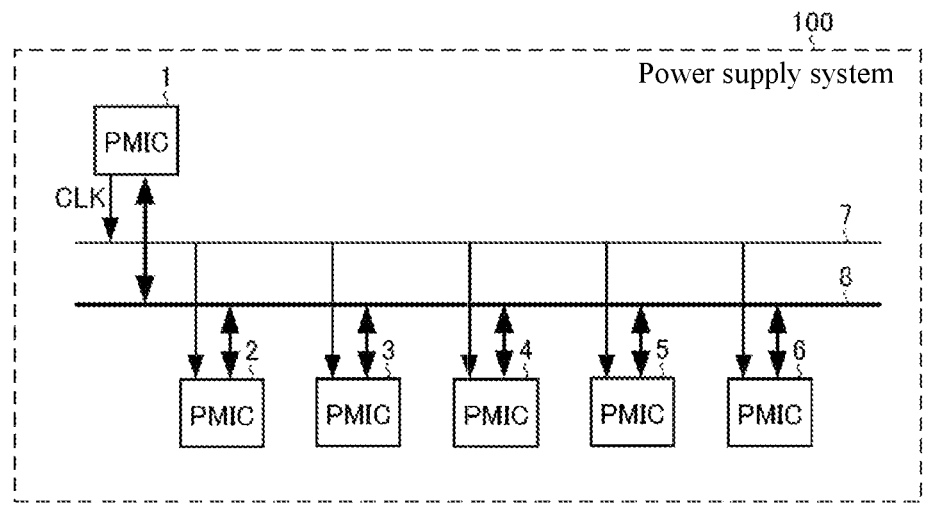
FIG. 1 is a brief configuration diagram of a power supply system according to an embodiment.
FIG. 2 is an exemplary diagram of device IDs.

FIG. 1 shows a brief configuration diagram of a power supply system according to an embodiment. A power supply system 100 shown in FIG. 1 includes power management integrated circuits (PMICs) 1 to 6, a first transmission line 7 and a second transmission line 8. The first transmission line 7 and the second transmission line 8 form a communication bus.

Each of the PMICs 1 to 6 includes at least one output terminal for outputting an output voltage. Each of the PMICs 1 to 6 further includes an input terminal for inputting an input voltage. Each of the PMICs 1 to 6 includes power supply circuits such as a linear regulator and a switching regulator, and generates at least one output voltage from the input voltage.

The PMIC 1 supplies a clock signal CLK to the PMICs 2 to 6 via the first transmission line 7. The PMIC 1 is sometimes referred to as a master circuit below. The PIMCs 2 to 6 are sometimes referred to as slave circuits below, or the PIMCs 2 to 6 are sometimes referred to as slave circuits 1 to 5 below Based on the clock signal CLK, any one of the PMICs 1 to 6 can transmit data to another one via the second transmission line 8. That is, in the power supply system 100, data transmission from the master circuit to the slave circuits, data transmission from one slave circuit to another slave circuit, or data transmission from the slave circuits to the master circuit can be performed. Despite that the power supply system 100 is formed by the plurality of PMICs 1 to 6, by means of the data transmission above, one PMIC can perform various types of processing (for example, processing upon enabling or processing in case of an anomaly).

Device IDs and system serial numbers are to be described below.

Each of the PMICs 1 to 6 includes a storage circuit storing a device ID and a system serial number in a non-volatile manner. It is desired that the device ID and the system serial number stored in the storage circuit above can be re-written.

FIG. 2 shows an exemplary diagram of device IDs and FIG. 3 shows an exemplary diagram of system serial numbers. PN1 and PN2 are different product numbers of PMICs in FIG. 2 and FIG. 3. The number of channels (the number of ch) in FIG. 3 is a total number of output terminals that the power supply system has for outputting output voltages.

In the power supply system 100, the storage circuit of the PMIC 1 stores "3'b000" as the device ID, and stores "10" as the system serial number.

In the power supply system 100, the storage circuit of the PMIC 2 stores "3'b011" as the device ID, and stores "10" as the system serial number.

In the power supply system 100, the storage circuit of the PMIC 3 stores "3'b100" as the device ID, and stores "10" as the system serial number.

In the power supply system 100, the storage circuit of the PMIC 4 stores "3'b101" as the device ID, and stores "10" as the system serial number.

In the power supply system 100, the storage circuit of the PMIC 5 stores "3'b110" as the device ID, and stores "10" as the system serial number.

In the power supply system 100, the storage circuit of the PMIC 6 stores "3'b111" as the device ID, and stores "10" as the system serial number.

By means of storing the device IDs and system serial numbers above in the respective storage circuits of the PMICs 1 to 6, the power supply system 100 becomes a power supply system that includes 6 PMICs and a total number (the number of ch) of 17 output terminals for outputting output voltages. The power supply system 100 may be developed by developing two PMICs (with the product numbers PN1 and PN2). Moreover, if two PMICs (with the product numbers PN1 and PN2) are developed, for example, various power supply systems including the power supply system 100 as shown in FIG. 3 can be developed. That is, for example, the various power supply systems shown in FIG. 3 can handle diversified customer requirements at low costs.

Communication protocols are to be described below.

FIG. 4 shows a brief configuration diagram of a power management integrated circuit (PMIC). The PMIC shown in FIG. 4 includes a power supply circuit 11, an anomaly detection circuit 12, a control circuit 13, a storage circuit 14, an input terminal IN, output terminals OUT1 to OUTn, a first terminal T1 and a second terminal T2. The PMIC with the product number PN1 includes seven output terminals OUT1 to OUT7, and the PMIC with the product number PN2 includes two output terminals OUT1 and OUT2.

The power supply circuit 11 converts an input voltage VIN applied to the input terminal IN to output voltages VOUT1 to VOUTn, and supplies the output voltages VOUT1 to VOUTn to the output terminals OUT1 to OUTn.

The anomaly detection circuit 12 detects anomalies of the power supply circuit 11, and outputs a detection result to the control circuit 13. An example of the anomalies is such as an overvoltage of the output voltages VOUT1 to VOUTn, a low voltage of the output voltages VOUT1 to VOUTn, or an overcurrent of currents supplied to the output terminals OUT1 to OUTn.

The control circuit 13 controls the power supply circuit 11. In other words, the control circuit 13 manages the power supply circuit 11. The control circuit 13 includes a confirmation circuit 13A, a mediation circuit 13B, a synchronizing confirmation circuit 13C, a clock signal processing circuit 13D and a transmitting/receiving circuit 13E.

The confirmation circuit 13A confirms that the second transmission line 8 is currently not transmitting data before the control circuit 13 is to start transmitting data to the second transmission line 8.

The mediation circuit 13B mediates an authority of transmitting data before the control circuit 13 starts transmitting data to the second transmission line 8 when a plurality of the PMICs 1 to 6 are scheduled to transmit data to the second transmission line 8.

The synchronizing confirmation circuit 13C confirms synchronization with the clock signal CLK before the control circuit 13 is to start transmitting data to the second transmission line 8.

The clock signal processing circuit 13D outputs the clock signal CLK from the first terminal T1 when the PMIC is set as the master circuit (when set to a first setting) according to the device ID stored in the storage circuit 14.

The clock signal processing circuit 13D inputs the clock signal CLK from the first terminal T1 when the PMIC is set as the slave circuit (when set to a second setting) according to the device ID stored in the storage circuit 14.

The transmitting/receiving circuit 13E receives data input to the second terminal T2 based on the clock signal CLK, and transmits data output from the second terminal T2 based on the clock signal CLK.

Figure 5:
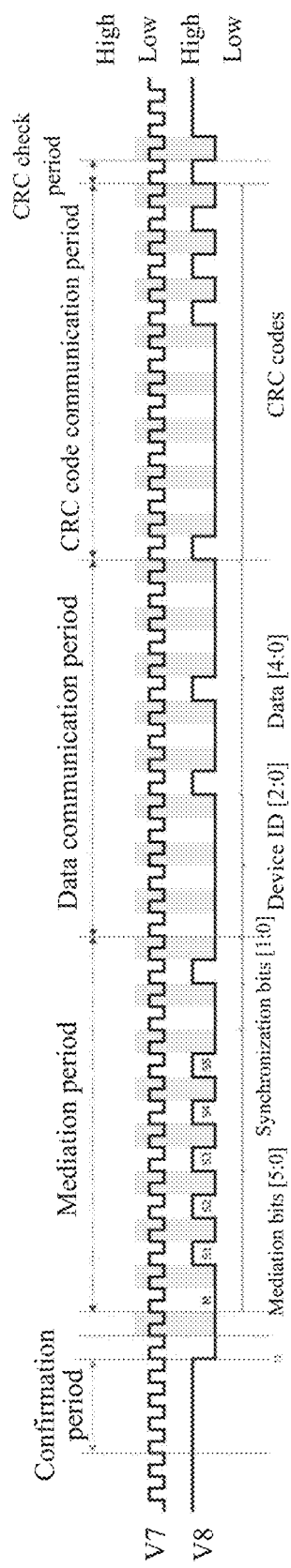
FIG. 5 is a timing diagram of a voltage applied to a first transmission line and a voltage applied to a second transmission line.

FIG. 5 shows a timing diagram of a voltage applied to the first transmission line 7 and a voltage applied to the second transmission line 8. More specifically, FIG. 5 shows a timing diagram of a voltage V7 applied to the first transmission line 7 and a voltage V8 applied to the second transmission line 8 when the PMIC 1 serves as the master circuit that transmits data.

Under data communication protocols of the second transmission line 8, the voltage V8 applied to the second transmission line 8 becomes at a low level at an interval of every one cycle of the clock signal CLK (the gray parts shown in FIG. 5). Thus, if the high level of the voltage V8 applied to the second transmission line 8 lasts for four cycles of the clock signal CLK, data communication of the second transmission line 8 is not performed.

In FIG. 5, if the voltage V8 applied to the second transmission line 8 is kept at a high level during four cycles of the clock signal CLK, the confirmation circuit 13A of the PMIC 1 confirms that the second transmission line 8 is currently not transmitting data. At a timing at which the confirmation is obtained (a timing t1 shown in FIG. 5), the transmitting/receiving circuit 13E of the PCMI 1 switches the voltage V8 applied to the second transmission line 8 from a high level to a low level. Then, the transmitting/receiving circuit 13 of the PMIC 1 sets the voltage V8 applied to the second transmission line 8 to a low level at an interval of one cycle of the clock signal CLK (the gray parts shown in FIG. 5).

The transmitting/receiving circuit 13E of the PMIC 1 sets the voltage V8 applied to the second transmission line 8 to a low level over a predetermined time during a mediation period (the first cycle of the clock signal CLK during the mediation period). Based on the level of the voltage V8 applied to the second transmission line 8 during the mediation period, the mediation circuit 13B of the PMIC 1 confirms that the other PMICs, that is, the PMICs 2 to 6, are not to start data communication. More specifically, since the voltage V8 applied to the second transmission line 8 is at a high level in one of the $3^{rd}$, $5^{th}$, $7^{th}$, $9^{th}$ and $11^{th}$ cycles of the clock signal CLK during the mediation period, the mediation circuit 13B of the PMIC 1 confirms that the other PMICs, that is, the PMIC 2 to PMIC 6, are not to start data communication.

In the last four cycles of the clock signal CLK within the mediation period, the transmitting/receiving circuit 13E of each of the PMICs 1 to 6 switches the voltage V8 applied to the second transmission line 8 sequentially to a low level, a low level, a high level and a low level in each cycle of the clock signal CLK.

In the last four cycles of the clock signal CLK within the mediation period, the synchronizing confirmation circuit 13C of the PMIC 1 determines whether the voltage V8 applied to the second transmission line 8 sequentially switches to a low level, a low level, a high level and a low level in each cycle of the clock signal CLK. If the voltage V8 applied to the second transmission line 8 does not sequentially switch to a low level, a low level, a high level and a low level in each cycle of the clock signal CLK, the PMICs 1 to 6 are not synchronized, and thus the transmitting/receiving circuit 13E of the PMIC 1 stops data transmission.

If the voltage V8 applied to the second transmission line 8 sequentially switches to a low level, a low level, a high level and a low level in each cycle of the clock signal CLK, the transmitting/receiving circuit 13E of the PMIC 1 sequentially transmits an address of a PMIC as the data transmission destination and transmits data to be transmitted to the PMIC as the data transmission destination during the data communication period. Then, during a cyclic redundancy check (CRC) code communication period, the transmitting/receiving circuit 13E of the PMIC 1 transmits CRC codes corresponding to the address and the data of the data communication period to the PMIC as the data transmission destination, and the transmitting/receiving circuit 13E of the PMIC as the data transmission destination transmits a CRC check result to the PMIC 1 during a CRC check period.

Figure 6:
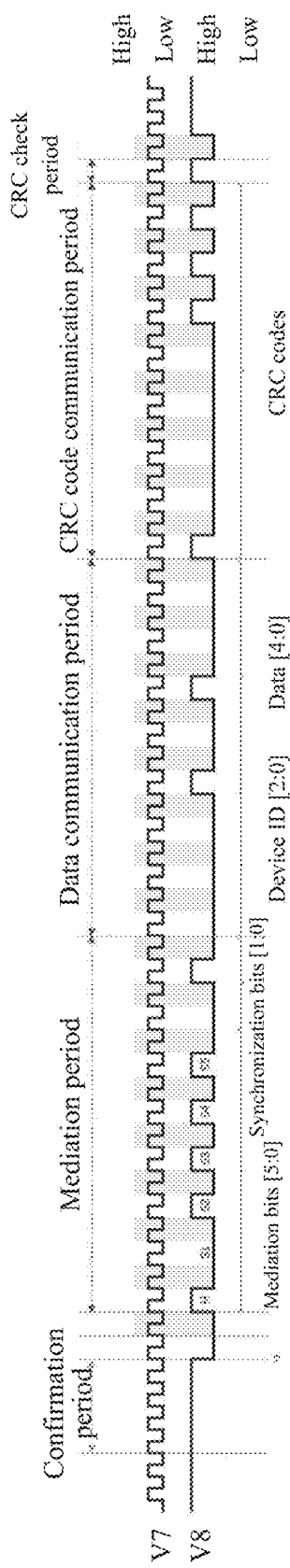
FIG. 6 is a timing diagram of a voltage applied to a first transmission line and a voltage applied to a second transmission line.

FIG. 6 shows a timing diagram of a voltage applied to the first transmission line 7 and a voltage applied to the second transmission line 8. More specifically, FIG. 6 shows a timing diagram of the voltage V7 applied to the first transmission line 7 and the voltage V8 applied to the second transmission line 8 when the PMIC 2 serves as the slave circuit 1 that transmits data.

In FIG. 6, if the voltage V8 applied to the second transmission line 8 is kept at a high level during four cycles of the clock signal CLK, the confirmation circuit 13A of the PMIC 2 confirms that the second transmission line 8 is currently not transmitting data. At a timing at which the confirmation is obtained (a timing t1 shown in FIG. 6), the transmitting/receiving circuit 13E of the PMIC 2 switches the voltage V8 applied to the second transmission line 8 from a high level to a low level. Then, the transmitting/receiving circuit 13E of the PMIC 2 sets the voltage V8 applied to the second transmission line 8 to a low level at an interval of one cycle of the clock signal CLK (the gray parts shown in FIG. 6).

The transmitting/receiving circuit 13E of the PMIC 2 sets the voltage V8 applied to the second transmission line 8 to a low level over a predetermined time during the mediation period (one 3rd cycle of the clock signal CLK during the mediation period). Based on the level of the voltage V8 applied to the second transmission line 8 during the mediation period, the mediation circuit 13B of the PMIC 2 confirms that the other PMICs, that is, the PMICs 1 and 3 to 6, are not to start data communication. More specifically, since the voltage V8 applied to the second transmission line 8 is at a high level in one of the $1^{st}$, $5^{th}$, $7^{th}$, $9^{th}$ and $11^{th}$ cycles of the clock signal CLK during the mediation period, the mediation circuit 13B of the PMIC 2 confirms that the other PMICs, that is, the PMICs 1 and 3 to 6, are not to start data communication.

In the last four cycles of the clock signal CLK within the mediation period, the transmitting/receiving circuit 13E of each of the PMICs 1 to 6 switches the voltage V8 applied to the second transmission line 8 sequentially to a low level, a low level, a high level and a low level in each cycle of the clock signal CLK.

In the last four cycles of the clock signal CLK within the mediation period, the synchronizing confirmation circuit 13C of the PMIC 2 determines whether the voltage V8 applied to the second transmission line 8 sequentially switches to a low level, a low level, a high level and a low level in each cycle of the clock signal CLK. If the voltage V8 applied to the second transmission line 8 does not sequentially switch to a low level, a low level, a high level and a low level in each cycle of the clock signal CLK, the PMICs 1 to 6 are not synchronized, and thus the transmitting/receiving circuit 13E of the PMIC 2 stops data transmission.

If the voltage V8 applied to the second transmission line 8 sequentially switches to a low level, a low level, a high level and a low level in each cycle of the clock signal CLK, the transmitting/receiving circuit 13E of the PMIC 2 sequentially transmits an address of a PMIC as the data transmission destination and transmits data to be transmitted to the PMIC as the data transmission destination during the data communication period. Then, during the CRC code communication period, the transmitting/receiving circuit 13E of the PMIC 2 transmits CRC codes corresponding to the address and the data of the data communication period to the PMIC as the data transmission destination, and the transmitting/receiving circuit 13E of the PMIC as the data transmission destination transmits a CRC check result to the PMIC 1 during the CRC check period.

Figure 7:
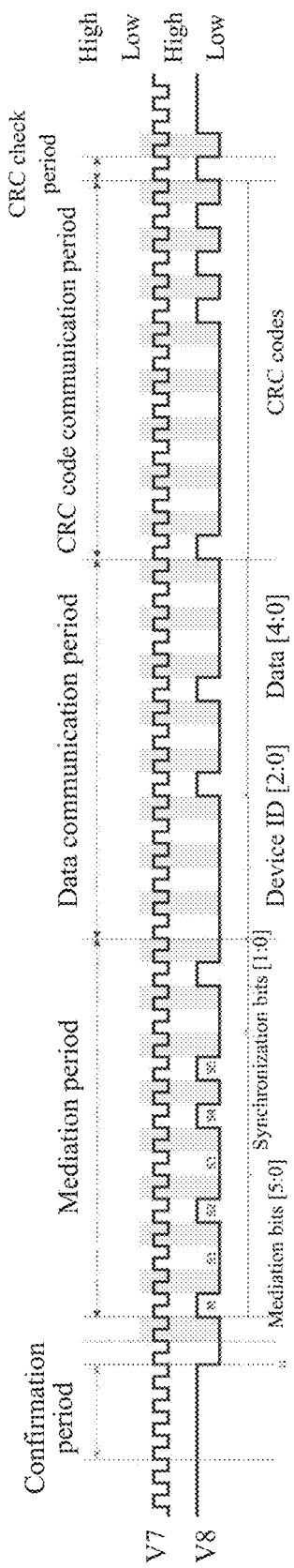
FIG. 7 is a timing diagram of a voltage applied to a first transmission line and a voltage applied to a second transmission line.

FIG. 7 shows a timing diagram of a voltage applied to the first transmission line 7 and a voltage applied to the second transmission line 8. More specifically, FIG. 7 shows a timing diagram of the voltage V7 applied to the first transmission line 7 and the voltage V8 applied to a second transmission line 8 when the PMIC 2 serving as the slave circuit 1 and the PMIC 4 serving as the slave circuit 3 substantially simultaneously switch the voltage V8 applied to the second transmission line 8 from a high level to a low level.

In FIG. 7, if the voltage V8 applied to the second transmission line 8 is kept at a high level during four cycles of the clock signal CLK, the confirmation circuit 13A of each of the PMICs 2 and 4 confirms that the second transmission line 8 is currently not transmitting data. At a timing at which the confirmation is obtained (a timing t1 shown in FIG. 7), the transmitting/receiving circuit 13E of each of the PMICs 2 and 4 switches the voltage V8 applied to the second transmission line 8 from a high level to a low level. Then, the transmitting/receiving circuit 13E of each of the PMICs 2 and 4 sets the voltage V8 applied to the second transmission line 8 to a low level at an interval of one cycle of the clock signal CLK (the gray parts shown in FIG. 7) till the mediation period has ended. Once the mediation period has ended, the transmitting/receiving circuit 13E of the PMIC 4 sets the voltage V8 applied to the second transmission line 8 to a low level at an interval of one cycle of the clock signal CLK (the gray parts shown in FIG. 7).

The transmitting/receiving circuit 13E of the PMIC 2 sets the voltage V8 applied to the second transmission line 8 to a low level over a predetermined time during the mediation period (one 3rd cycle of the clock signal CLK during the mediation period). The transmitting/receiving circuit 13E of the PMIC 4 sets the voltage V8 applied to the second transmission line 8 to a low level over a predetermined time during the mediation period (one 7th cycle of the clock signal CLK during the mediation period). Based on the level of the voltage V8 applied to the second transmission line 8 during the mediation period, the mediation circuit 13B of the PMIC 2 confirms that the other PMIC, that is, the PMIC 4, is to start data communication. More specifically, since the voltage V8 applied to the second transmission line 8 is at a low level in one 7th cycle of the clock signal CLK during the mediation period, the mediation circuit 13B of the PMIC 2 confirms that the other PMIC, that is, the PMIC 4, is to start data communication. Based on the level of the voltage V8 applied to the second transmission line 8 during the mediation period, the mediation circuit 13B of the PMIC 4 confirms that the other PMIC, that is, the PMIC 2, is to start data communication. More specifically, since the voltage V8 applied to the second transmission line 8 is at a low level in one 3rd cycle of the clock signal CLK during the mediation period, the mediation circuit 13B of the PMIC 4 confirms that the other PMIC, that is, the PMIC 2, is to start data communication.

In the last four cycles of the clock signal CLK within the mediation period, the transmitting/receiving circuit 13E of each of the PMICs 1 to 6 switches the voltage V8 applied to the second transmission line 8 sequentially to a low level, a low level, a high level and a low level in each cycle of the clock signal CLK.

In the last four cycles of the clock signal CLK within the mediation period, the synchronizing confirmation circuit 13C of the PMIC 2 determines whether the voltage V8 applied to the second transmission line 8 sequentially switches to a low level, a low level, a high level and a low level in each cycle of the clock signal CLK. If the voltage V8 applied to the second transmission line 8 does not sequentially switch to a low level, a low level, a high level and a low level in each cycle of the clock signal CLK, the PMICs 1 to 6 are not synchronized, and thus the transmitting/receiving circuit 13E of the PMIC 2 stops data transmission.

If the voltage V8 applied to the second transmission line 8 sequentially switches to a low level, a low level, a high level and a low level in each cycle of the clock signal CLK, the transmitting/receiving circuit 13E of the PMIC 2 sequentially transmits an address of a PMIC as the data transmission destination and transmits data to be transmitted to the PMIC as the data transmission destination during the data communication period. Then, during the CRC code communication period, the transmitting/receiving circuit 13E of the PMIC 2 transmits CRC codes corresponding to the address and the data of the data communication period to the PMIC as the data transmission destination, and the transmitting/receiving circuit 13E of the PMIC as the data transmission destination transmits a CRC check result to the PMIC 1 during the CRC check period.

The storage circuit 14 of each PMIC stores priorities in case of conflicts of starting of data communication. In this embodiment, the priority of the PMIC 4 is set to be higher than that of the PMIC 2.

The PMIC 2 gives up the starting of data communication since the PMIC 4 having a higher priority is to start data communication.

In the last four cycles of the clock signal CLK within the mediation period, the synchronizing confirmation circuit 13C of the PMIC 4 determines whether the voltage V8 applied to the second transmission line 8 sequentially switches to a low level, a low level, a high level and a low level in each cycle of the clock signal CLK. If the voltage V8 applied to the second transmission line 8 does not sequentially switch to a low level, a low level, a high level and a low level in each cycle of the clock signal CLK, the PMICs 1 to 6 are not synchronized, and thus the transmitting/receiving circuit 13E of the PMIC 4 stops data transmission.

If the voltage V8 applied to the second transmission line 8 sequentially switches to a low level, a low level, a high level and a low level in each cycle of the clock signal CLK, the transmitting/receiving circuit 13E of the PMIC 4 sequentially transmits an address of a PMIC as the data transmission destination and transmits data to be transmitted to the PMIC as the data transmission destination during the data communication period. Then, during the CRC code communication period, the transmitting/receiving circuit 13E of the PMIC 4 transmits CRC codes corresponding to the address and the data of the data communication period to the PMIC as the data transmission destination, and the transmitting/receiving circuit 13E of the PMIC as the data transmission destination transmits a CRC check result to the PMIC 1 during the CRC check period.

Because the confirmation period is provided in the power supply system 100, conflicts of data transmission of the plurality of PMICs can be avoided. Moreover, with the mediation period provided in the power supply system 100, even in case of close timings of starting of data transmission of a plurality of PMICs, conflicts of data transmission of the plurality of PMICs can still be avoided.

Figure 8:
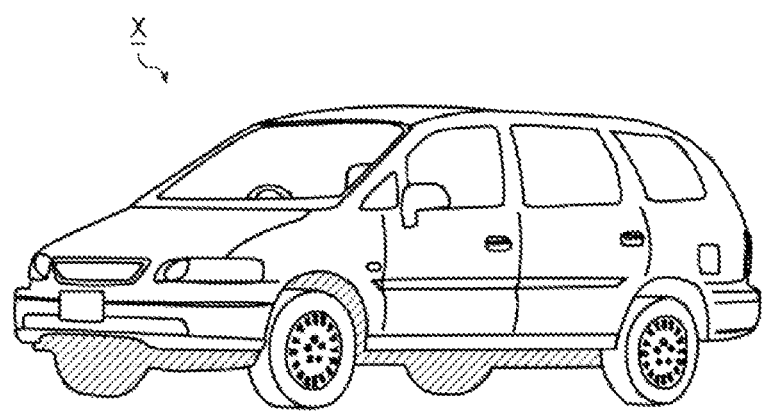
FIG. 8 is a diagram showing the appearance of a vehicle according to an embodiment.

FIG. 8 is a diagram showing the appearance of a vehicle X according to an embodiment. The vehicle X includes the power supply system 100. Moreover, the vehicle X includes a battery (not shown). An output voltage of the battery (not shown) is input voltages of the PMICs 1 to 6. The power supply system 100 is a power supply device of a plurality of on-vehicle machines (not shown) mounted in the vehicle X.

In addition, various modifications may be made to the embodiments above without departing from the scope of the subject matter of the present disclosure. It should be noted that, all the details of the embodiments above are illustrative rather than limitative, and a person skilled in the art should understand that the technical scope of the present disclosure is disclosed by the appended claims instead of the descriptions of the embodiments above. Moreover, the technical scope also includes meanings equivalent to the appended claims and all variations encompassed within the scope of the appended claims.

The power supply system 100 above is configured to include six PMICs; however, the total number of the PMICs (the first semiconductor integrated circuit and the second semiconductor integrated circuit) included in a power supply system is not limited to being six, but may be plural.

Moreover, as power supply systems including a plurality of PMICs, FIG. 3 only depicts the two power supply systems (the power supply system with the system serial number [2] and the power supply system with the system serial number [3]) including two PMICs, two power supply systems (the power supply system with the system serial number [4] and the power supply system with the system serial number [5]) including three PMICs, two power supply systems (the power supply system with the system serial number [6] and the power supply system with the system serial number [7]) including four PMICs, two power supply systems (the power supply system with the system serial number [8] and the power supply system with the system serial number [9]) including five PMICs, and two power supply systems (the power supply system with the system serial number [10] and the power supply system with the system serial number [11]) including six PMICs; however, these power supply systems are merely examples for illustration purposes.

What is claimed is:

1. A power supply system, comprising:
a single first semiconductor integrated circuit (IC);
at least one second semiconductor IC;
a first transmission line;
a second transmission line, wherein
each of the single first semiconductor IC and the at least one second semiconductor IC includes at least one output terminal configured to output an output voltage,
the single first semiconductor IC is configured to supply a clock signal to the at least one second semiconductor IC via the first transmission line, and
based on the clock signal, one of the single first semiconductor IC and the at least one second semiconductor IC is configured to transmit a data signal via the second transmission line to another one,
wherein each of the single first semiconductor IC and the at least one second semiconductor IC includes a confirmation circuit, configured to confirm the second transmission line does not transmit data before starting a transmission of the data signal,
wherein each of the single first semiconductor IC and the at least one second semiconductor IC includes a synchronizing confirmation circuit, configured to confirm a synchronization of the first semiconductor IC and the at least one second semiconductor IC with the clock signal during a first period, wherein each of the single first semiconductor IC and the at least one second semiconductor IC starts a transmission of the data signal during a second period after the first period;
wherein confirming synchronization of the first semiconductor IC and the at least one second semiconductor IC with the clock signal includes determining whether a voltage applied to the second transmission line sequentially switches to a predetermined sequence in last clock cycles during the first period.

2. The power supply system of claim 1, wherein the confirmation circuit is configured to confirm the second transmission line does not transmit the data signal if a voltage applied to the second transmission line over a predetermined period of the clock signal is at a predetermined level.

3. The power supply system of claim 1, wherein each of the single first semiconductor IC and the at least one second semiconductor IC includes a mediation circuit, configured to mediate an authority of transmitting the data signal before starting a transmission of the data signal when a plurality of the single first semiconductor IC and the at least one second semiconductor IC are scheduled to transmit the data signal.

4. The power supply system of claim 2, wherein each of the single first semiconductor IC and the at least one second semiconductor IC includes a mediation circuit, configured to mediate an authority of transmitting the data signal before starting a transmission of the data signal when a plurality of the single first semiconductor IC and the at least one second semiconductor IC are scheduled to transmit the data signal.

5. The power supply system of claim 3, wherein the mediation circuit is configured to, based on a level of voltage applied to the second transmission line, determine whether or not the plurality of the single first semiconductor IC and the at least one second semiconductor IC are scheduled to transmit the data signal.

6. The power supply system of claim 4, wherein the mediation circuit is configured to, based on a level of voltage applied to the second transmission line, determine whether or not the plurality of the single first semiconductor IC and the at least one second semiconductor IC are scheduled to transmit the data signal.

7. A semiconductor IC, comprising:
a first terminal, connectable to a first transmission line;
a second terminal, connectable to a second transmission line;
at least one output terminal, configured to output an output voltage;
a clock signal processing circuit, configured to output a first clock signal to the first terminal in a first setting and input a second clock signal from the first terminal in a second setting;
a transmitting/receiving circuit, configured to,
in the first setting, receive a first data signal input to the second terminal based on the first clock signal, and transmit a second data signal output from the second terminal based on the first clock signal, and
in the second setting, receive the first data signal input to the second terminal based on the second clock signal, and transmit the second data signal output from the second terminal based on the second clock signal;
a confirmation circuit, configured to confirm the second transmission line is not transmitting data before the transmitting/receiving circuit starts receiving the first data signal and transmitting the second data signal; and
a synchronizing confirmation circuit, configured to confirm a synchronization of the semiconductor IC with the first or second clock signal during a first period, wherein the reception and transmission of the first or second data starts during a second period after the first period;

wherein confirming synchronization of the semiconductor IC with the first or second clock signal includes determining whether a voltage applied to the second transmission line sequentially switches to a predetermined sequence in last clock cycles during the first period.

8. A vehicle, comprising the power supply system of claim 1.

9. A vehicle, comprising the power supply system of claim 2.

10. A vehicle, comprising the power supply system of claim 3.

11. A vehicle, comprising the power supply system of claim 5.

* * * * *